April 30, 1968 C. W. LOGAN ET AL 3,381,071

ELECTRICAL CIRCUIT INSULATION METHOD

Filed April 12, 1965

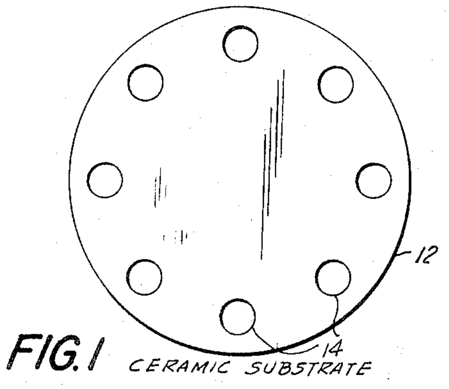

FIG. 1 CERAMIC SUBSTRATE

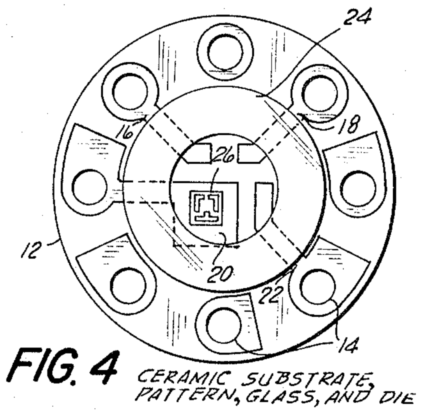

FIG. 4 CERAMIC SUBSTRATE, PATTERN, GLASS, AND DIE

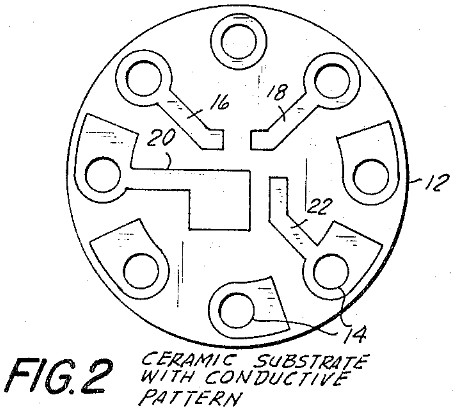

FIG. 2 CERAMIC SUBSTRATE WITH CONDUCTIVE PATTERN

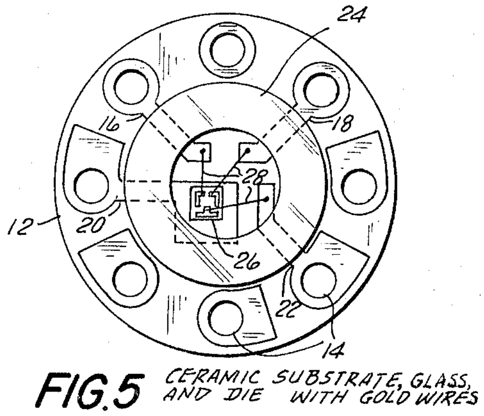

FIG. 5 CERAMIC SUBSTRATE, GLASS, AND DIE WITH GOLD WIRES

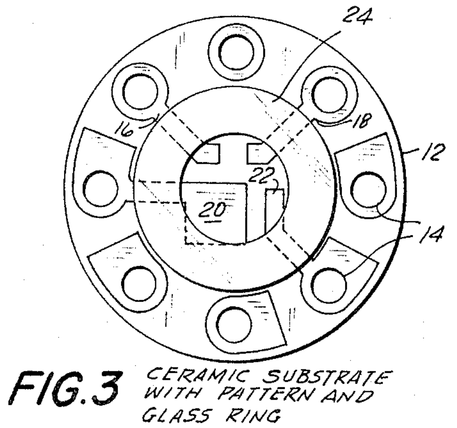

FIG. 3 CERAMIC SUBSTRATE WITH PATTERN AND GLASS RING

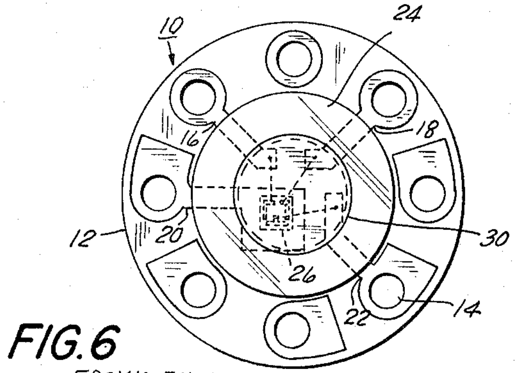

FIG. 6 EPOXY ENCAPSULATED STRUCTURE

INVENTORS
C. WAYNE LOGAN
ROBERT L. TRENT
BY
Curtis, Morris & Safford
ATTORNEYS

United States Patent Office 3,381,071

Patented Apr. 30, 1968

3,381,071

ELECTRICAL CIRCUIT INSULATION METHOD

Charles Wayne Logan, New Fairfield, and Robert L. Trent, Westport, Conn., assignors to National Semiconductor Corporation, Danbury, Conn.

Filed Apr. 12, 1965, Ser. No. 447,220
7 Claims. (Cl. 264—135)

The present invention relates to electrical circuit insulation methods; more particularly, the present invention relates to processes in which selected portions of electrical circuits and devices are coated with insulating materials while other parts remain free from such materials.

"Potting" electrical circuits and components is a common and highly desirable method of insulating and protecting them. "Potting" involves flowing a selected liquid onto the electrical circuits or components and then hardening the liquid so as to form a hard, tough insulating coating covering over the circuits and components.

Suitable potting compounds are liquids capable of hardening into an impervious insulating mass which retains its hardness and insulating properties at the temperatures and under the other conditions at which the circuit must operate. The most widely used potting compounds are polymerizing-type resins. Of these resins, polyester and epoxy resins have proved to be highly desirable. Such resins typically are mixed with a catalyst and applied at room temperatures as a liquid. The liquid covers the physical objects to which it has been applied, and flows into any small crevices that may exist. Then the resin is "cured" and forms a hard, continuous insulating coating over the objects.

In potting or encapsulating electrical circuits and components with such liquid potting compounds, a serious problem occurs when it is desired to apply the liquid only to certain selected portions of an electrical circuit or component and leave the remainder uncoated. The liquid potting compound tends to spread over the whole surface to which it is applied. This problem is especially acute in circuit devices in which a number of components and conductors are mounted in a single-plane surface in close proximity to one another. A "printed circuit" is one example of such devices; it usually comprises a flat insulating board having conductive patterns, terminals, and circuit components mounted in close proximity to one another on its surfaces. "Thin film circuits" and "hybrid circuits" are other examples of devices in which these problems are especially acute. A "thin film circuit" usually comprises an extremely small insulating substrate upon which circuit conductors and components have been formed by vapor deposition or other known techniques. A "hybrid circuit" is a combination of components formed by transistor manufacturing techniques in a flat substrate of semiconductor material with other circuit components and conductors formed on the flat surface of the substrate by thin film or other techniques. In all of these planar devices, liquid insulating compounds applied to the areas to be coated tend to spread over areas not desired to be coated so that electrical connections cannot be made to the circuit.

It is an object of the present invention to provide an insulating method which prevents the undesired spread of liquid insulating compounds on electrical circuit devices, components and conductive patterns.

Another object of the present invention is to provide such a method which is simple and economical.

Briefly, the present invention comprises forming a thin insulating layer on the surfaces of the circuit device at the boundaries between the portions to be "potted" and the remaining portions of the device. This thin coating retards the spread of the liquid potting compound and holds it on the desired surface portion until it has hardened. The finished encapsulating structure comprises a combination of the thin insulating coating together with the hardened potting compound.

The drawings and description that follow describe the invention and indicate some of the ways in which it can be used. In addition, some of the advantages provided by the invention will be pointed out.

In the drawings:

FIGURES 1 through 6 illustrate typical steps used in the process of the present invention, and FIGURE 6 illustrates the insulating structure of the invention.

Referring first to FIGURE 1, a circular disk 12 of ceramic material forms the base or substrate for the circuit device 10 shown in FIGURE 6. The disk 12 is approximately 0.02 inch thick and preferably is made of high-density alumina ceramic material sold by American Lava Company. Disk 12 has eight holes spaced equally around its periphery to serve as terminal holes for making external connections to the circuit.

Referring now to FIGURE 2, in the next process step, a pattern of gold conductors is coated on the surface of ceramic base 12 by a well-known silk-screen process. One conductor surrounds each hole 14, and four of the conductors 16, 18, 20 and 22, extend inwardly towards the center of the disk 12. The conductor 20 is shaped so as to provide a conductive mounting base for the mounting of a semiconductor device 26 (see FIGURE 4), and the conductors 16, 18 and 22 are shaped so that their innermost ends are easily used as connection points for the electrical leads 28 (see FIGURE 5) of the semiconductor device 26. If desired, thin film resistors and other cricuit elements can be formed between selected conductors to make a complete circuit arrangement having both active and passive components.

It is desired to "pot" or encapsulate the semiconductor device 26 and its leads 28 in order to protect these delicate parts from physical damage and contamination, and to electrically insulate them. However, if the potting process leaves even the slightest amount of insulating compound on the conductive areas around holes 14, electrical connections to the device 10 cannot be made. Unfortunately, if liquid potting compounds such as liquid epoxy-catalyst mixtures are placed on the semiconductor device 26 and leads 28, they tend to flow along the conductors and coat the conductive areas around the holes 14, thus making it difficult to make connections to the circuit device. It is costly and impractical to remove the undesired coating from around holes 14.

Referring now to FIGURE 3, in accordance with the present invention, a thin, ring-shaped glass coating 24 is laid down over the conductive pattern between the central regions of the device and the conductive areas around the holes 14. This thin coating stops the flow of liquid potting mixtures from the center of the disk 12 towards the peripheral conductive areas.

Glass ring 24 is applied by a screening process in which glass particles are suspended in a carrier liquid which is applied through a fine screen. The disk 12 then is heated or "fired" at a temperature just sufficient to melt the glass in the ring 24 and evaporate the carrier liquid. When the glass is melted, it is fused into a very smooth and continuous insulating coating. The glass coating is from 0.001 to 0.003 inch (1 to 3 mils) thick. The glass preferably is Du Pont low melting temperature glass, or Corning #7561 borosilicate glass.

Materials other than glass can be used to form ring 24. The material should be a good insulator, should be capable of being applied in thin coatings, and should be a relatively hard, impervious solid at the desired operating temperatures for the device 10. For example, materials such as "Teflon," nylon and the like can be applied in thin coatings to form the ring coating 24.

After ring 24 is formed, the semiconductor device 26 is mounted on the enlarged area of conductor 20 by standard alloying techniques (see FIGURE 4). Next (see FIGURE 5), the electrical leads 28 are connected from the semiconductor device 26 to the innermost ends of conductors 16, 18 and 22 by standard thermal-compression bonding techniques. After the completion of this bonding step, the assembly is cleaned with solvent baths and de-ionized water, and is oven-dried.

Referring now to FIGURE 6, a single drop of a mixture of liquid epoxy resin and catalyst is dropped onto the semiconductor device 26 in the central portion of the disk 12. The epoxy resin used is "Stycast" 2850 epoxy resin which is sold by Emmerson & Cummings, Inc., Camden, Mass., and is mixed with the Emmerson & Cummings catalyst #9 or #11 prior to application to the disk 12. When it is at room temperatures the epoxy mixture has a viscosity similar to that of honey and starts to flow outwardly from the point of application.

The epoxy mixture then is heated at 60° C. for one hour to "fix" the mixture, and then is heated at 160° C. for 24 hours to cure the mixture and form it into a hard, impervious coating over the semiconductor device 26, its leads 28, and the central portions of the disk 12. The potting compound flows much more readily than at first due to the decrease in viscosity of the compound as it is heated first at 60° C. and then 160° C. However, the thin glass ring 24 presents a barrier to the outward flow of even this thinned liquid. The epoxy flows just over the inner edge of glass ring 24 so as to form a slight overlap between the epoxy insulation 30 and the glass ring 24.

The above-described insulating method and structure are simple and inexpensive. The flow-stopping insulating coating can be applied in a practically infinite number of different complex patterns to a variety of different surfaces to shape the potting compound into a covering for oddly-shaped components and circuits. Since it is very thin, it weighs very little and occupies very little space. It is ideally suited for use in miniaturized circuit devices such as printed circuits, thin film circuits and similar devices. In fact, the invention makes it possible to inexpensively encapsulate many components of such circuits which previously could not be so treated.

The above description of the invention is intended to be illustrative and not limiting. Various changes or modifications in the embodiments described may occur to those skilled in the art and these can be made without departing from the spirit or scope of the invention as set forth in the claims.

We claim:

1. A process for applying a protective covering for an electrical device having a selected region with connecting conductors having extended portions, said process comprising:

(a) applying a coating of insulating material between the selected region and the extended portions of the conductors to form a boundary for liquid between said selected region and the extended portions of said connecting conductors;

(b) dispensing within the selected region a hardenable viscous liquid to cover said selected region, said formed boundary preventing the flow of said liquid to the extended portions of said conductors; and (c) hardening said liquid to form a protective covering for said selected region.

2. A process as in claim 1 in which said insulating material in said thin coating is glass.

3. A process as in claim 1 in which said viscous liquid is a polymerizing-type resin.

4. A process as in claim 1 in which said viscous liquid is selected from a group consisting of epoxy and polyester resins.

5. A process as in claim 1 in which said viscous liquid is an epoxy resin mixed with a hardening catalyst.

6. A process for encapsulating electrical components within a selected region of a single-plane electrical circuit-board device having connected to said components extended conductive connecting terminals located in the same plane as said components, said process comprising:

(a) applying by screening methods a coating to form a boundary of fused glass for liquid between said selected region and the extended conductive terminals;

(b) dispensing within said selected region a liquid epoxy resin potting compound with a catalyst, said compound covering said selected region to encapsulate said components therein, the boundary thereby formed preventing the flow of said potting compound beyond said selected region; and (c) heating said device to cure and harden said potting compound.

7. A process for encapsulating electrical components within a selected region of a single-plane electrical circuit-board device having connected to said components extended conductive connection terminals located in the same plane as said components, said process comprising:

(a) applying a coating to form a boundary of fused glass for liquid between the selected region and the extended conductive terminals;

(b) dispensing within the selected region a liquid polymerizing type resin compound to cover said selected region and said components therein, the boundary formed preventing the flow of said resin compound beyond said selected region; and (c) heating said device to cure and harden said compound with said terminals uncoated.

References Cited

UNITED STATES PATENTS

| | | | |
|---|---|---|---|
| 3,178,506 | 4/1965 | Dereich et al. | 264—272 |
| 3,187,240 | 6/1965 | Clark | 29—155.5 |
| 3,249,466 | 5/1966 | Lusher | 65—18 |

ROBERT F. WHITE, *Primary Examiner.*

J. R. HALL, *Assistant Examiner.*